United States Patent
Tiwari et al.

(10) Patent No.: US 12,463,647 B2
(45) Date of Patent: Nov. 4, 2025

(54) LEVEL SHIFTER AND MULTI-VOLTAGE-DOMAIN CIRCUITS

(71) Applicant: NXP B.V., Eindhoven (NL)

(72) Inventors: Chandra Prakash Tiwari, Bangalore (IN); Tao Sun, Shanghai (CN); Hongyue Zhu, Shanghai (CN); Peiying Song, Shanghai (CN); Yehao Shen, Shanghai (CN)

(73) Assignee: NXP B.V., Eindhoven (NL)

( * ) Notice: Subject to any disclaimer, the term of this patent is extended or adjusted under 35 U.S.C. 154(b) by 70 days.

(21) Appl. No.: 18/515,621

(22) Filed: Nov. 21, 2023

(65) Prior Publication Data

US 2024/0178840 A1 May 30, 2024

(30) Foreign Application Priority Data

Nov. 24, 2022 (IN) .............................. 202221067743
May 25, 2023 (EP) ...................................... 23175334

(51) Int. Cl.
 *H03K 19/0185* (2006.01)
 *H03K 3/356* (2006.01)

(52) U.S. Cl.
 CPC .............. *H03K 19/018521* (2013.01); *H03K 3/356113* (2013.01)

(58) Field of Classification Search
 CPC ...... H03K 19/018521; H03K 3/356113; G05F 1/10; G05F 1/46; G05F 3/02; G05F 3/08; G05F 3/10; G11C 5/147
 See application file for complete search history.

(56) References Cited

U.S. PATENT DOCUMENTS

| | | |
|---|---|---|
| 6,369,612 B1 | 4/2002 | Shokouhi |
| 6,407,579 B1 | 6/2002 | Goswick |
| 6,437,627 B1 | 8/2002 | Tran et al. |
| 6,442,082 B2 | 8/2002 | Taura et al. |
| 6,483,353 B2 * | 11/2002 | Kim ................. H03K 3/356113 327/55 |
| 6,600,357 B1 | 7/2003 | Kirihara |

(Continued)

FOREIGN PATENT DOCUMENTS

| | | |
|---|---|---|
| CN | 105897246 A | 8/2016 |
| CN | 112543020 A | 3/2021 |
| JP | 3512763 B2 | 3/2004 |

*Primary Examiner* — Jung Kim

(57) ABSTRACT

An electronic circuit that switchably generates an offset-bias output at a offset-bias voltage in response to at least an enable signal at a low voltage relative to the offset-bias voltage is provided. The electronic circuit includes a reference input terminal, configured to be connected to a reference voltage; a low-voltage-input terminal, configured to receive the enable signal at a first voltage; a high-voltage-supply terminal, configured to receive power at a second voltage; an offset-bias output terminal, configured to output the offset-bias output, the offset-bias voltage being less than the second voltage; a voltage-offset circuit configured to generate the offset-bias voltage from the second voltage; a bias circuit configured to switchably provide a bias current to the voltage-offset circuit; and a high-voltage stand-off circuit, connected between the bias circuit and the voltage-offset circuit and configured to withstand a voltage difference between the second voltage and the reference voltage.

20 Claims, 6 Drawing Sheets

(56) References Cited

U.S. PATENT DOCUMENTS

| | | |
|---|---|---|
| 7,224,202 B2 | 5/2007 | Pauletti |
| 9,252,775 B2 | 2/2016 | Schrom et al. |
| 9,543,931 B2 | 1/2017 | Chen |
| 9,768,778 B2 | 9/2017 | Kwon et al. |
| 10,325,666 B2 | 6/2019 | Tran et al. |
| 10,348,304 B2 | 7/2019 | Ullmann et al. |
| 10,840,907 B1 | 11/2020 | Werking |
| 2009/0066398 A1 | 3/2009 | Yo |
| 2016/0336940 A1 | 11/2016 | Kwon et al. |
| 2018/0138898 A1 | 5/2018 | Nallamothu |
| 2019/0097633 A1 | 3/2019 | Ullmann et al. |

* cited by examiner

LEVEL SHIFTER AND MULTI-VOLTAGE-DOMAIN CIRCUITS

CROSS-REFERENCE TO RELATED APPLICATIONS

This application claims the priority under 35 U.S.C. § 119 of Indian Patent Application number 202221067743, filed on 24 Nov. 2022, the contents of which are incorporated by reference herein. This application also claims the priority under 35 U.S.C. § 119 of European Patent application no. 23175334.4, filed on 25 May 2023, the contents of which are incorporated by reference herein.

BACKGROUND

Field of the Disclosure

The present disclosure relates to level shifters, and to electronic circuits such as multi-voltage domain circuits, for level shifters and other applications.

Description of the Related Art

Many electronic circuits, such as but not limited to power management devices and power delivery devices, operate at relatively high voltages. For the purposes of this disclosure, a voltage will be considered as a high voltage if it is large relative to operating voltages of transistor-transistor logic (TTL) or other digital circuitry. Typically such digital devices operate at voltages of the order of 5 V±10%, 2.5V±10%, or in the case of CMOS logic typically 1.8 V±10% or lower. A high-voltage circuit may typically be operational at, for instance 10V, 24 V or 48 V (such as is typical for automotive applications), or higher voltages such as 100V or 200V, which may be typical for power delivery for other applications.

Since transistors in digital control circuits typically can only operate at low voltages (for instance 5.5 V or less in the case of a typical CMOS transistor design), high-voltage electronic circuits often utilise so-called "level shifters". A conceptual level shifter 100 is shown in FIG. 1. The level shifter 100 is connected to a reference voltage which may be a ground voltage 110 at 0V as shown, and includes a low-level voltage rail $V_A$ 120. An input signal IN 130, which may be a digital signal, is provided between ground 110 and $V_A$ 120. $V_A$ 120 may be a fixed voltage rail, or may simply be a "high" value of the input signal IN 130. A typical value for $V_A$ may be 5V as discussed above Level shifter 100 is also connected to a high-voltage rail or input $V_B$ 140. $V_B$ may be, as mentioned above 24V, 48V or even higher. $V_B$ defines a "high-voltage domain". Taking a 48V application such as is common in automobile uses as a concrete, but non-limiting, example, the function of the level shifter 100 is to "shift" the voltage level of the input signal IN 130 (which is between 0 V and 5 V in this instance) to provide an output OUT 160 in the high voltage domain such that (referenced to ground), instead of varying between 0 and 5 V. it varies between $V_B$ and another voltage $V_C$ 150, which is tied to $V_B$. In this example, $V_C$ may be 48V-5V, that is to say 43 V. It will be noted that the voltage swing (that is to say, $V_B$-$V_C$) in the higher domain need not be the same as that ($V_A$-GND) in the low domain. It will be appreciated that in the above, the term "vary" has been used: in the case of a binary digital signal, "vary" corresponds to switching between the two levels. However, the present disclosure is not limited to binary digital switching, so the signals IN 130 and OUT 160 may include intermediate values between the high and the low value or even may vary in an analogue fashion.

Various circuits are known to generate or derive the voltage $V_C$. However, such circuits often result in high leakage currents, which may be undesirable. Furthermore, in the case that the difference between $V_C$ and $V_B$ is tied to the voltage swing on the input signal IN 130, existing level shifters may exhibit poor linearity as the magnitude of IN 130 is varied. The present disclosure may address one or more of these limitations.

SUMMARY

According to a first aspect of the present disclosure, there is provided an electronic circuit, configured to switchably generate an offset-bias output at a offset-bias voltage ($V_C$) in response to at least an enable signal (EN) at a low voltage relative to the offset-bias voltage, and comprising: a reference input terminal, configured to be connected to a reference voltage (GND); a low-voltage-input terminal, configured to receive the enable signal at a first voltage; a high-voltage-supply terminal, configured to receive power at a second voltage ($V_B$); an offset-bias output terminal (526), configured to output the offset-bias output, wherein the offset-bias voltage is less than the second voltage; a voltage-offset circuit (510) configured to generate the offset-bias voltage from the second voltage; a bias circuit (530) configured to switchably provide a bias current (Ib1) to the voltage-offset circuit; and a high-voltage stand-off circuit (550), connected between the bias circuit and the voltage-offset circuit and configured to withstand a voltage difference between the second voltage ($V_B$) and the reference voltage (GND); wherein the voltage-offset circuit (510) comprises: a push-pull circuit; a voltage-drop circuit (512) comprising a series arrangement of a set of M−1 diode-connected p-FETs (P1, P3) each having a gate-source voltage Vgs, connected between the high-voltage-supply terminal and a first node (528) of the push-pull circuit to provide a voltage (M−1).Vgs therebetween; and a variable current source (514), connected between the high-voltage-supply terminal and the offset-bias output terminal and configured to provide a variable current at the offset-bias output terminal to stabilise the voltage offset; and wherein the push-pull circuit (520) comprises a further p-FET having a gate-source voltage Vgs and at least one, N, n-FET connected between the high-voltage-supply terminal and the bias output terminal and having a threshold voltage Vt, and arranged to provide a voltage difference Vgs+N·(Vt) between the first node and the offset-bias output terminal.

Such a circuit may enable a stable output voltage difference VB−VC in the high voltage domain, and in particular one which is relatively insensitive to changes in process, voltage and temperature (PVT).

In one or more embodiments, the electronic circuit may further comprise a pull-up circuit (540) configured to tie the bias voltage to the second voltage in response to the enable signal not enabling the electronic circuit. In particular it may be convenient to prevent the voltage $V_C$ of the offset-bias output from floating when the circuit is not enabled.

In one or more embodiments each p-FET of the plurality of series-connected FETs is configured to be diode-connected by having its drain connected to its respective gate. This may help to stabilise the voltage across the respective FET.

In one or more embodiments, M=3. In other embodiments, M may have a different value and in particular may be equal to 2 or 4. This may provide for a choice of the value of the difference between $V_B$ and $V_C$.

In one or more embodiments, N=1, and the source of the n-FET is connected to the high-voltage-supply terminal, and a drain of the n-FET is connected to the offset-bias output terminal.

In one or more other embodiments, N=2, such that there is a first n-FET and a second n-FET, a gate of the first n-FET is connected to the gate of the further p-FET, the drain of the first n-FET is connected to a gate of a second n-FET, the drain of the second n-FET is connected to the offset-bias output terminal, and the source of each of the first and second n-FET is connected to the high-voltage-supply terminal. This may provide for a choice of the value of the difference between $V_B$ and $V_C$.

In one or more embodiments, the bias circuit may comprise a bias input configured to receive an input bias current, and a current mirror configured to provide the bias current (Ib1) as a copy of the input bias current (Ib). Such a bias current may be useful to control the voltage offset between $V_B$ and $V_C$.

In one or more embodiments, the electronic circuit may further comprise a first switch configured to switchably disconnect the current mirror from the reference terminal in response to the enable signal not enabling the electronic circuit. Such a switch may help to reduce the quiescent current consumption of the circuit when not operational.

In one or more embodiments, the electronic circuit may further comprise a second switch configured to switchably disconnect the current mirror from the bias input in response to the enable signal not enabling the electronic circuit. Such a switch may help to further reduce the quiescent current consumption of the circuit when not operational. In one or more embodiments the current mirror may comprise a pair of n-FETs, the first switch comprises a p-FET, and the second switch comprises an n-FET.

According to one or more embodiments, the push-pull circuit comprises at least one switch configured to switchably disconnect the push-pull circuit from at least one of the current mirror and the reference terminal, in response to the enable signal not enabling the electronic circuit.

According to one or more embodiments the voltage-offset circuit (510) further comprises an additional set of M−1 series-connected p-type FETs, connected between the high-voltage-supply rail ($V_B$) and the bias output terminal, each having a gate connected to a respective corresponding gate of the first set of series-connected FETs.

According to one or more embodiments the pull-up circuit comprises a resistor and a capacitor, each connected between the high-voltage-supply terminal and the bias output terminal. According to one or more embodiments, the electronic circuit may further comprise an input terminal (IN), wherein the electronic circuit is configured to generate the bias output in response to both the enable signal and an input signal on the input terminal.

According to a second aspect of the present disclosure, there is provided a level-shifting circuit arranged to shift a signal having a low and a high state from a low-voltage domain to a high-voltage domain, comprising an electronic circuit as just described, a level shifter and wherein the offset-bias output is provided to the level shifter as a voltage for the low state of the high-voltage domain.

In one or more embodiments, and without limitation, the difference between the second voltage and the offset-by voltage is between 1.0 and 5.5V. In one of more embodiments, and without limitation, the second voltage is between 24 and 48 V. In one of more embodiments, and without limitation, the second voltage is between 100 and 200 V. In one of more embodiments, and without limitation, the bias current is between 0.5 uA and 1 uA.

These and other aspects of the invention will be apparent from, and elucidated with reference to, the embodiments described hereinafter.

BRIEF DESCRIPTION OF THE DRAWINGS

Embodiments will be described, by way of example only, with reference to the drawings, in which.

Figure 1:
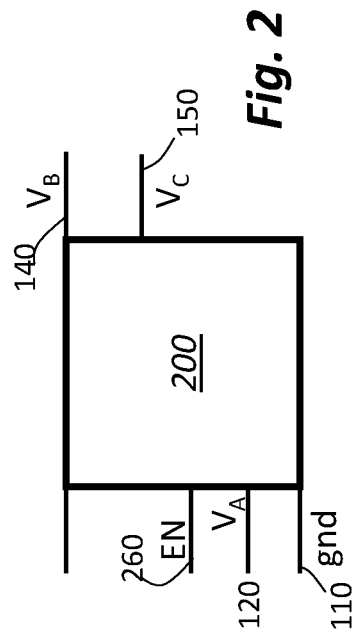
FIG. 1 illustrates, conceptually, a level shifter.

It should be noted that the figures are diagrammatic and not drawn to scale. Relative dimensions and proportions of parts of these figures have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

As mentioned above, FIG. 1 shows, conceptually, a level shifter 100. The level shifter may generate the voltage level $V_C$ linked to the high voltage rail $V_B$, or may be provided with the voltage rail $V_C$ from an external circuit.

Figure 2:
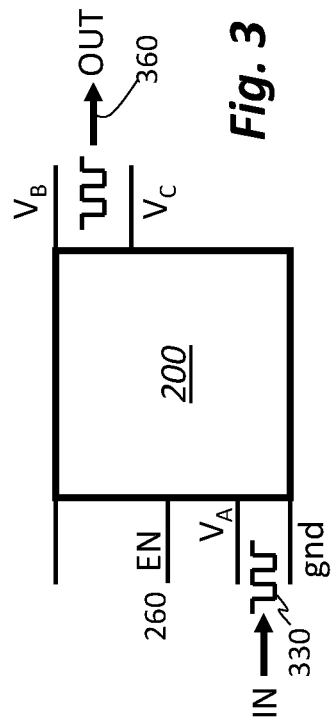
FIG. 2 illustrates, conceptually, a high voltage circuit according to embodiments.
Figure 3:
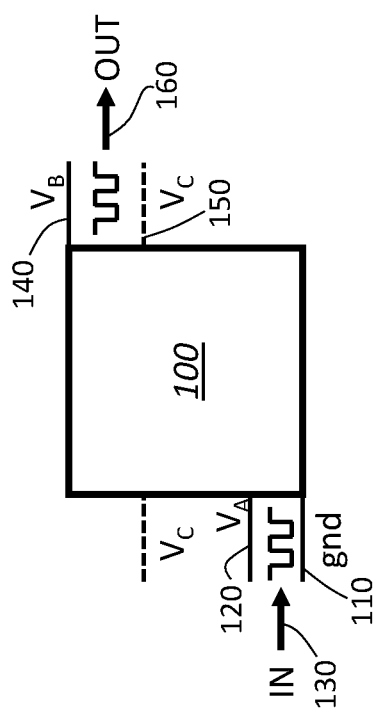
FIG. 3 illustrates, conceptually a high-voltage circuit according to embodiments implemented as a level-shifter.

FIG. 2 shows a high voltage circuit 200 consistent with one or more embodiments of the present disclosure. The high voltage circuit may alternatively be referred to as a multi-voltage-domain circuit, a "floating high voltage level shifter", or a voltage-level setting circuit. The high voltage circuit is provided with an input at a reference level which may be for instance GND 0 V, and a low-voltage level $V_A$. The high voltage circuit 200 is further provided with a high-voltage rail $V_B$ 140. The function of the high voltage circuit 200 is to provide a voltage level $V_C$ which is tied to the high voltage rail $V_B$. Operation of the high voltage circuit 200 is controlled by an enable input EN 260. In particular, the circuit is arranged to generate the voltage $V_C$ in case that an enable signal is "on" (which according to one convention may be the case when enable is low or 0). Conversely, when the enable signal is "off" the circuit is disabled and does not generate the voltage $V_C$. The high-voltage circuit 200 may have various applications, two of which are shown, schematically, in FIG. 3 and FIG. 4:

FIG. 3 illustrates the circuit of FIG. 2 being implemented directly as a level shifter. The circuit is provided with a further signal, being an input signal IN 330, in the low-voltage domain, that is to say IN has a value 0 (or ground, 110) in its "low" state and a value $V_A$, 120, in its "high" state. Hereinafter a "low" state of signal will be taken to correspond to the signal being "off" and a "high" state of the signal will be taken to correspond to the signal being "on". However, the skilled person will appreciate that the opposite convention (such that "low" corresponds to "on") may be equally applicable to some embodiments. Furthermore, the skilled person will appreciate that a "low" value of the signal need not correspond exactly to 0 V or ground but will be close to that value and, similarly, a "high" value of the signal need not correspond exactly to the voltage $V_A$, but will be close to $V_A$. In an implementation of the high voltage circuit such as that shown in FIG. 3, the circuit provides an output OUT 360. In operation, provided the enable signal EN 260 is "on", then the output OUT follows the input signal IN, but translated, or shifted, to the high voltage domain. The output OUT may be used as a floating power supply for one or more other circuits, such as but not limited to a conventional level shifter.

Figure 4:
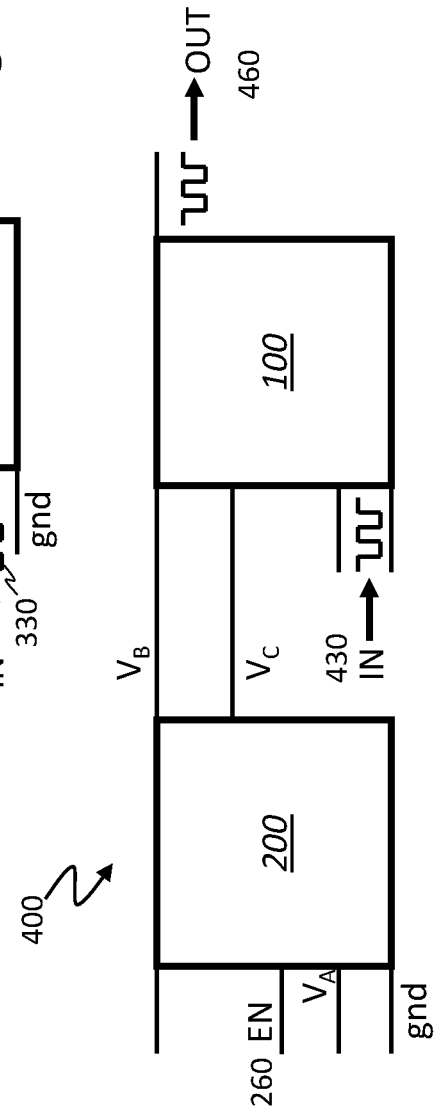
FIG. 4 illustrates, conceptually, a high-voltage circuit according to embodiments together with a linked level shifter.

FIG. 4 illustrates the circuit of FIG. 2 implemented as a floating power supply for a conventional level shifter 100. In embodiments such as that shown in FIG. 4, the high voltage circuit 200 provides an output voltage $V_C$ in response to the enable signal EN 260 being "on". The input for the level shifter, IN 430, is then shifted, in voltage, by the level shifter to the high voltage domain to provide output OUT 460, which follows the input 430. Thus the output OUT 460 switches between the high voltage rail $V_B$ and the voltage level $V_C$ supplied by the high voltage circuit 200.

Figure 5:
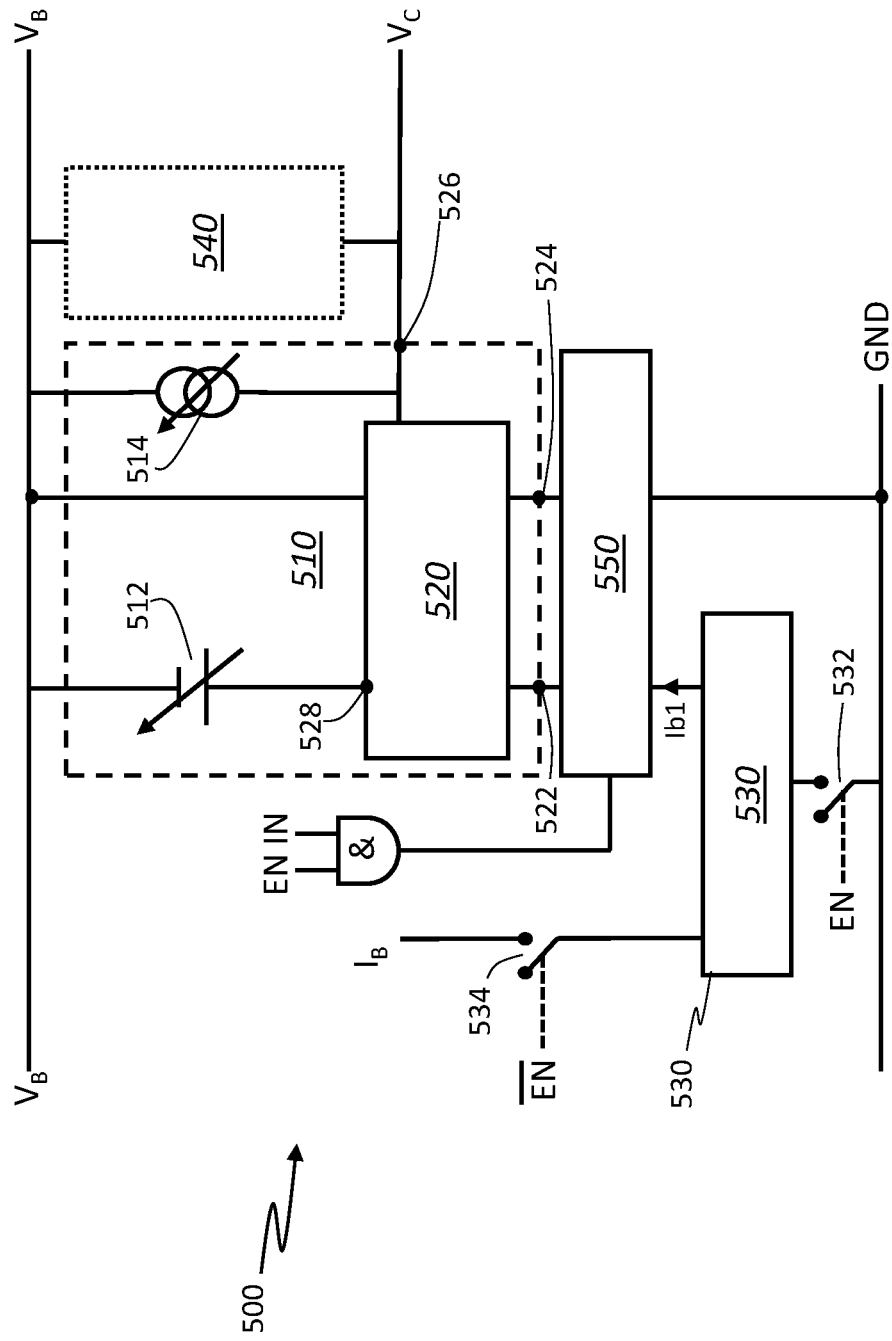
FIG. 5 shows, schematically, the principle elements of a high voltage circuit 500 according to embodiments of the present disclosure.

Turning now to FIG. 5, this shows, schematically, the principal elements of a high voltage circuit 500 according to embodiments of the present disclosure. High-voltage circuit 500 comprises five main circuit or blocks. Voltage-offset circuit (or block) 510 is configured to fix, in operation, the voltage $V_C$, relative to the high voltage power supply rail $V_B$. Push-pull circuit (or block) 520 is configured to stabilise the offset voltage provided by voltage-offset circuit 510 circuit block. Bias circuit (or block) 530 is configured to provide, under appropriate conditions, a suitable bias current to the push-pull circuit 520. High-voltage stand-off circuit (or block) 550, which may alternatively be referred to as a voltage isolation circuit, comprises high-voltage switches, and is configured to provide voltage isolation between the high voltage domain ($V_C$ to $V_B$), and the low voltage domain (GND to $V_{IN}$) And finally, pull up circuit (or block) 540 is configured to, in an "off"-state or when VC is not required, reduce or minimise leakage current by ensuring that $V_C$ is pulled to the same voltage as the supply rail $V_B$.

Operation of the circuit 500 shown in FIG. 5 according to embodiments of the present disclosure will now be described. Firstly, consider the situation when enable signal EN is off (that is to say, in the implementation shown, it is low). Bias circuit 530 is disabled: the bias circuit 530 is pulled low by closing switch 532, and the bias current $I_B$ is disconnected from bias circuit 530 by opening switch 534. Furthermore, the high voltage switches in the high-voltage stand-off circuit 550 are switched off (that is to say, opened) since at least one (in this case enable EN) of the inputs IN and EN are off. Turning off the switches in the high-voltage stand-off circuit 550 isolates the high-voltage domain (which includes voltage-offset circuit 510 and pull-up circuit 540) from the low-voltage; in other words the nodes 522 and 524 between the high-voltage stand-off circuit 550 and the voltage-offset circuit 510 are isolated from ground. It further prevents the voltage-offset circuit 510 from operating to control $V_C$. In order to prevent $V_C$ from floating, a pull up circuit 540 may be provided. Pull up circuit 540 may provide one or both of a high-ohmic or capacitive connection between $V_C$ and $V_B$, such that, in the absence of active control by the voltage-offset circuit 510, the voltage $V_C$ is pulled up, to be equal to the high voltage rail $V_B$. Because the voltage-offset circuit 510 has been disabled, the circuit consumes a very low quiescent current, that is to say when it is not enabled. This may be, for example, of the order of <10 nA.

Consider now the situation when the enable signal EN is "on" (that is to say, in the implementation shown, it is high). Switch 534 is closed (i.e. on) and so bias current $I_B$ is provided to the bias circuit 530. Moreover, switch 532 is open (i.e. "off") and thus the high-voltage stand-off circuit 550 is not disabled. Operation of the high-voltage stand-off circuit 550 is then dependent on the status of the input IN. If the input is off (that is to say, in this implementation, low), the high-voltage stand-off circuit 550 is switched off (similar to the situation when the enable signal EN is low). In this case state the voltage-offset circuit 510 is disabled and $V_C$ takes the same value as $V_B$, as described above. Conversely, if the input is "on" (that is to say, in this implementation, high), then the nodes 522 and 524 are connected to the ground level GND. However, since the bias circuit 530 is now enabled, it provides a bias current Ib1 to the high-voltage stand-off circuit 550. Current is provided through node 522 to the high-voltage stand-off circuit, and in particular to the push-pull circuit 520. The output of push-pull circuit 520 (at node 526 matches the input current at 522, so a current Ib1 is provided at node 526, and thus to the output $V_C$. In addition, the voltage offset circuit 510, which is enabled, provides a fixed voltage differential between the high voltage rail $V_B$ and the output $V_C$. At the same time, the voltage-offset circuit 510 defines the voltage at output $V_C$. In particular, the current Ib1 at node 522 flows to the voltage rail $V_B$ through a voltage-drop circuit 512. Voltage-drop circuit 512 may be implemented as a set of M series-connected p-FETs. In such an implementation, the uppermost p-FET is connected to the high voltage rail $V_B$ at its source, and its drain is connected to the next p-FET in the series-connected set. The gate of each FET is connected to its drain. Thus, the uppermost M−1 of the p-FETs comprise the voltage-drop circuit, or block, shown schematically in FIG. 5 as a variable voltage supply 512. (The skilled person will appreciate that the "voltage supply" which consists of the series-connected set of p-FETs may be considered to be variable in that the voltage across each FET is modified by the current through it.) In this implementation, the lowermost p-FET forms part of the push-pull circuit 520. Apart from the lowermost p-FET, each p-FET in the series-connect set has its gate coupled to the gate of a corresponding set of (M−1) n-FETs which are series-connected between the high voltage rail $V_C$ and the output $V_B$. This set of (M−1) n-FETs comprises a variable current source, depicted as 514 in FIG. 5. The gate of the lowermost FET in the series-connected set is connected to the gate of an FET of opposite type which is directly connected between the high voltage rail $V_B$ and the output $V_C$. It can be seen that the voltage at the output $V_C$ is related to the voltage at the high voltage rail $V_B$, by:

$$V_C = V_B - (M) \cdot Vgs - V_T,$$

where Vgs is the gate-source voltage of each of the series-connected FETs and $V_T$ is the threshold voltage the FET of opposite type.

Figure 6:
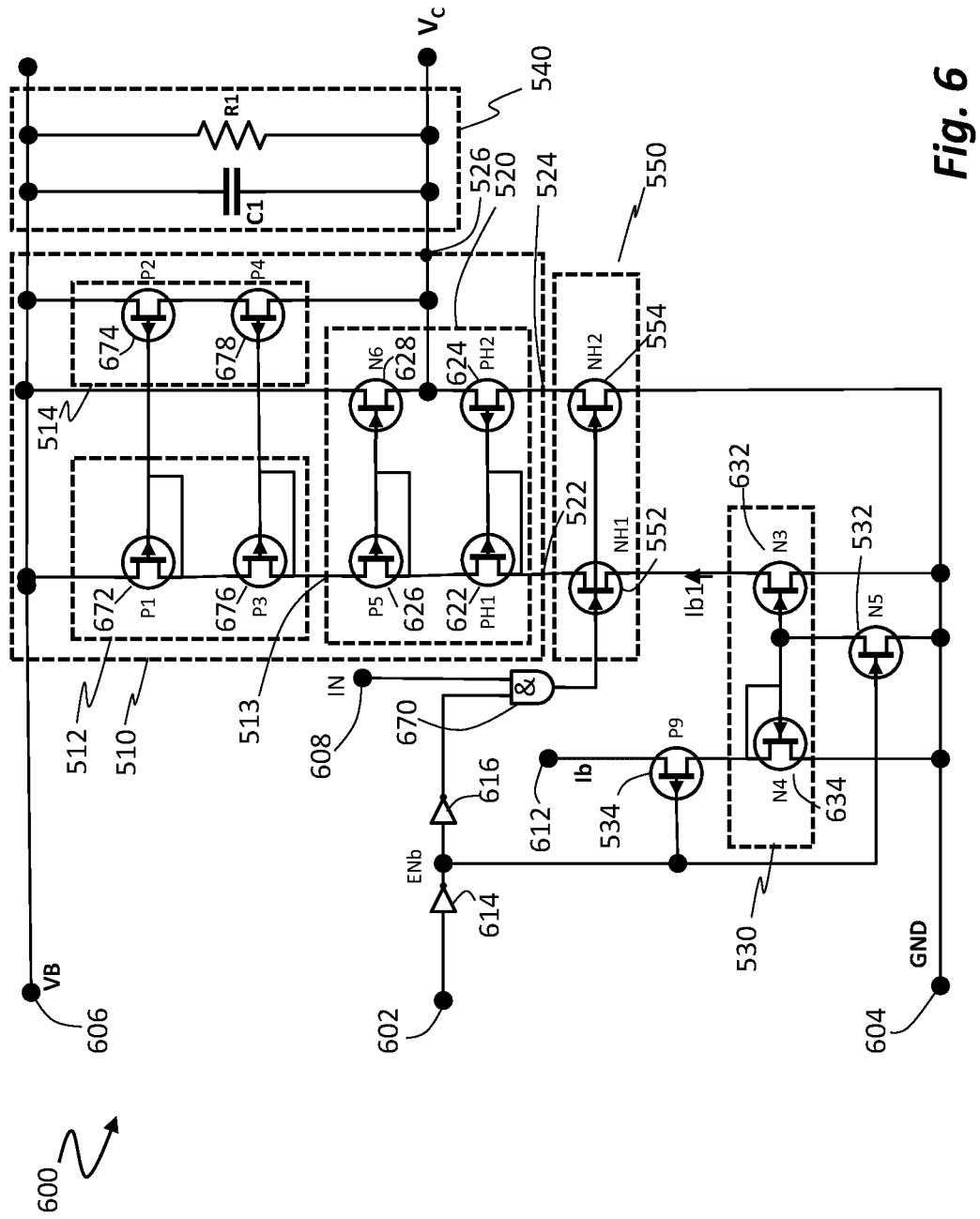
FIG. 6 shows a high voltage circuit 600, being a transistor-level schematic circuit implementation of the circuit shown in block form in FIG. 5.

FIG. 6 shows a high voltage circuit 600, being a transistor-level schematic circuit implementation of the circuit shown in block form in FIG. 5. Enable input EN is provided at terminal 602, the ground rail GND at terminal 604, and high-voltage-supply rail $V_B$ at terminal 606, and input IN at terminal 608. Terminal 612 is provided for receiving a bias current Ib. A pair of inverters 614, 616 are provided for generating the inverse, ENb, of the enable signal EN. Switches 532 and 534 are implemented as an n-FET N5 and p-FET P9 respectively. The gate, that is to say the control terminal, of n-FET N5 switch 532 is connected to the inverted enable input, ENb, as is the gate, that is to say the control terminal, of p-FET P9 switch 534.

The bias circuit 530 is configured as a current mirror comprising two FETs N3 632 and N4 634. When enabled, the current mirror provides a copy of bias input current Ib provided at a terminal 612 to the high-voltage stand-off circuit 550, as mirror current Ib1.

The high-voltage stand-off circuit 550 is configured as a pair of high-voltage n-FETs NH1 552 and NH2 554. As used herein, the terms "high-voltage n-FET" and "high-voltage p-FET" refer to FET devices which are able to withstand a significantly higher voltage than used in the logic circuits. For example, logic circuits may require, as discussed above approximately 5 V of operation between source and drain. In contrast, high-voltage FETs may be able to withstand 24 V, 48 V 100 V or even 200 V between their source and drain. References herein to FETs which are not referred to as high-voltage FETS may be considered to be references to (relatively) low-voltage FETs, that is to say to FETs which may not be able to withstand such high voltages (such as 24 V, 48 V, hundred V or even 200 V between drain and source), without sustaining damage. The gates of the n-FETs NH1 552 and NH2 554 are commonly connected to combinatorial logic 670, which may be implemented, as shown, as a single 'AND' gate having inputs connected to the enable EN terminal 602 and the IN terminal 608. The EN input may be directly connected to enable terminal 602 or, as shown, through the pair of inverters 614 and 616. The skilled person will appreciate that other forms of logic, and/or connection configurations may be used, provided that the gates are high if and only if the enable signal EN is high and the input signal IN is high. The source of one of the high-voltage n-FETs, NH1 552, is connected to the bias circuit 530 to receive copy bias currents Ib1; the source of the other n-FET, NH2 554, is connected directly to the ground rail. The drains of the n-FETs NH1 552 and NH2 554 are connected to the voltage-offset circuit 510 at nodes 522 and 524 respectively. The n-FETs 552 and 554 are high-voltage n-FETs. That is to say, in their off-state, they can withstand the voltage between the high voltage rail $V_B$ and ground.

The voltage-offset circuit 510, comprising the push-pull circuit 520, voltage-drop circuit 512, and current source 514 is, in this implementation, configured as follows. The push-pull circuit comprises a pair of p-FETs pH1 622 and pH2 624 having commonly connected gates. The gates are also connected to the drain of pH1 622, such that p-FET P5 626 is diode-connected. The p-FETs 622 and 624 are high-voltage p-FETs. That is to say, in their off-state, they can withstand the voltage between the high voltage rail $V_B$ and ground. The drain of p-FET PH1 622 is connected to node 522 for receiving the copy bias current Ib1 in the case that n-FET NH1 552 is on. The drain of p-FET PH2 624 is connected to node 524 and thus connected to the ground rail in the case that the n-FET NH2 554 is on. The push-pull circuit further comprises a second pair of FETs, p-FET P5 626 and n-FET N6 628. Again, these FETs have commonly connected gates which are also connected to the drain of p-FET P5 626. The drain of p-FET P5 626 is connected to the source of the p-FET PH1 622, and the source of the n-FET N6 628 is connected to the source of the p-FET PH2 624. A node 526 between the source of N-FET N6 628 and source of p-FET PH2 624 comprises the output node $V_C$.

P-FET P5 626 is further configured as the lowermost of a set of series-connected p-FETs P1 672, P3 676, and P5 626, comprised in the voltage-offset circuit. Excluding the lowermost p-FETs, this set of p-FETs (that is to say, P1 672 and P3 676) comprise the voltage-drop circuit 512. They are series-connected in the sense that the source of each device is connected to the next one up in the series, the source of the uppermost one in the series, in this case P1 672, being connected to the high voltage rail $V_B$. Each of the p-FETs is "diode-connected", that is to say its gate is tied to its drain. In operation, when there is current flowing, the voltage at the drain of the lowermost of the set of series-connected p-FETs (in this implementation P1 672, P3 676 and P5 626) is lower than the high-voltage rail voltage $V_B$, by the sum of the gate-source voltages (Vgs) of each of the transistors in the set. As shown, in this implementation there are three FETs so the voltage at the drain of P5 626 is 3×Vgs below $V_B$. Correspondingly, in the embodiment shown, the voltage drop circuit comprises a voltage drop of 2×Vgs. Since the lowermost transistor P5 626 is diode connected, this is also the voltage at the common gates of P5 626 and N6 628. Furthermore, in operation—that is to say when there is current flowing through N6—the voltage between the gate and source of N6 is its threshold voltage, $V_T$, such that the voltage difference between the node 513 connecting the voltage-drop circuit 512 to the push-pull circuit 500 and 20 is Vgs+$V_T$. So the voltage at output node or terminal $V_C$ 526 differs from $V_B$ by 3·Vgs+$V_T$.

In a more general case, where there is a set of M series-connected p-type FETs, the following relationship then applies:

$$V_C = V_B - (M \cdot \text{Vgs} + V_T)$$

As can be seen from FIG. 6, the push-pull circuit 520 includes an additional path between the node 513 and the offset-bias voltage output $V_C$. This is the route through P5 626, PH 162, and PH2 624. This results in a voltage drop between 513 and $V_C$ of Vgs+V'gs+V'$_T$, where V'gs is the gate source voltage through the high-voltage p FET pH 162, and $V_T$ is the threshold voltage of high-voltage p FET PH2 264.

Voltage offset circuit 510 further comprises an additional set of series-connected p-type FETs, connected between the high-voltage-supply rail $V_B$ and the output node $V_C$ 526, which comprise the current source 514. In the general case that there are (M−1) such series-connected p-type FETs so in the implementation shown in FIG. 6, where M equals three, there are two such FETs P2 674 and P4 678. Similarly to the series-connected set P1 672, P3 676 and P5 626, the uppermost one of the second set, P2 674 has its source connected to the high-voltage rail $V_B$ and its drain connected to the next p-FET in the set (in this case P4, 678). The lowermost one of the second set, in this case P4 678 has its drain connected to the output $V_C$ 526. The gates of each the FETs are connected to respective corresponding gate in the first set of series-connected FETs. In operation, these FETs P4 678 and P2 674 act to provide the current requirement during switching and stabilise the voltage $V_C$.

In the embodiment shown in FIG. 6, the pull-up circuit 540 is configured as a resistor R1 642 high-ohmic resistor connected between the high voltage rail $V_B$, and the output node $V_C$ 526, in parallel with a capacitor C1 644 also connected between the high voltage rail $V_B$, and the output node $V_C$ 526. As discussed above with respect to FIG. 5, in operation when there is no current flowing in the push-pull circuit 520, that is to say when the enable signal is EN low, or the enable signal EN is high and the input IN is low, the pull-up circuit acts to tie the voltage at output $V_C$ 526 to the high-voltage rail $V_B$.

Figure 7:
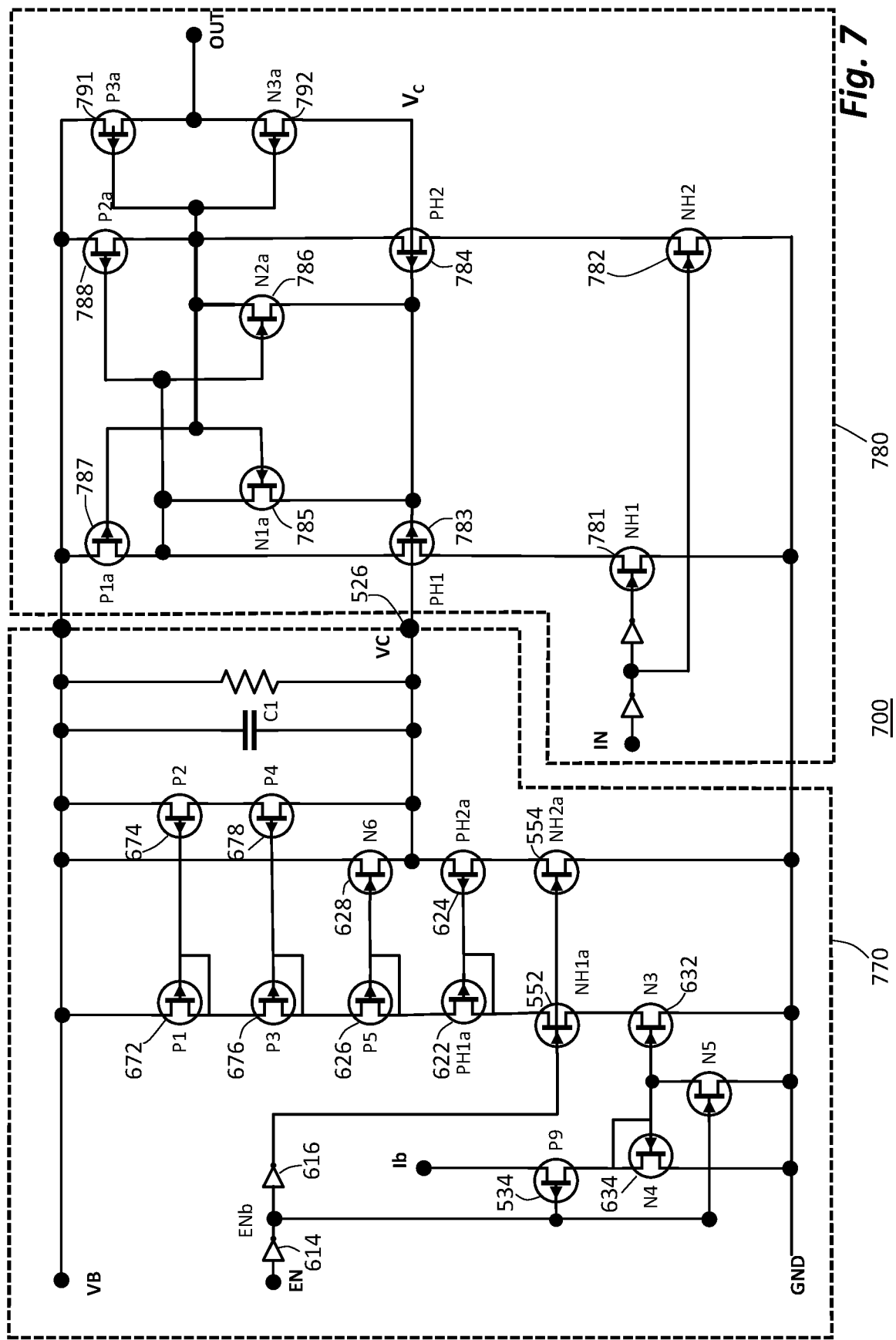
FIG. 7 shows a transistor-level circuit diagram, according to one or more other embodiments of the present disclosure.

FIG. 7 shows a transistor-level circuit diagram, according to one or more other embodiments of the present disclosure. It will be appreciated that whereas the embodiment shown in FIG. 6 broadly corresponds to the diagram shown in FIG. 3, this transistor level diagram broadly corresponds to the block diagram shown in FIG. 4. That is to say, whereas the electronic circuit shown in FIG. 6 could be implemented directly as a high voltage level shifter, the electronic circuit 700 shown in FIG. 7 may be considered to comprise a electronic circuit 770 acting as a stabilised high-voltage-supply for a level shifter 780.

The electronic circuit 770 is similar to that described with respect to FIG. 6 and so the corresponding parts will not be re-described. However, it differs in that it does not include an input IN. Instead, the bias output at the bias voltage $V_C$ is provided whenever the enable input EN is high. Similarly to the electronic circuit described with respect to FIG. 6, the bias voltage VC is related to the voltage at the high-voltage rail $V_B$, through the relationship $$V_C = V_B - M \cdot Vgs - V_T.$$

In the example of FIG. 7 M=3 (corresponding to p-FETs P1, P3 and P5), so $$V_C = V_B - 3 \cdot Vgs - V_T.$$

Since a typical value for Vgs is 1.4 V, and $V_T$ is typically of the order of 0.1 V, in a typical application $V_C$ is approximately 5 V lower the $V_B$.

$V_C$ acts as an output from electronic circuit 770 and as a "low" level, in the high-voltage domain, for an output of the level shifter 780 which voltage shifts an input signal (IN) in a low voltage domain (that is to say between the ground and a low voltage such as 5V or similar which corresponds to a "high" value of each of input IN and enable EN), to a high voltage domain (that is to say between $V_B$ and $V_C$. As an illustration only, a typical value of $V_B$ may be 48 V and thus a typical value of $V_C$ may be 43 V.

The level shifter 780 is a conventional level shifter with which the skilled person will be familiar, and thus will only be described in brief. The level shifter comprises two pairs of high-voltage FETs. A first pair of the high-voltage FETs are n-FETs, NH1 781 and NH2 782, connected to the ground rail and having their gates connected to the input IN and inverted copy of input IN respectively. The second pair of the high-voltage FETs are p-FETs, pH1 783 and pH2 784, connected to NH1 and NH2 respectively. The common gates of high-voltage p-FETs PH1 783 and PH2 784 are coupled to the drains of cross coupled n-FETs N1a 785 and N2a 786. The sources of high-voltage p-FETs PH1 783 and PH2 784 are coupled to respective drains of cross coupled p-FETs P1a 787 and P2 a 788, the sources of which are coupled to the high-voltage-supply rail $V_B$ and the gates of which are cross coupled with the gates of n-FETs N1a 785 and N2a 786. The commonly coupled gates are connected to the output OUT via a pair of FETs N3a 791, and P3a 792 which operate to invert the signal (relative to the high-voltage bus rail $V_B$ and $V_C$ rather than ground and the low voltage input IN, as the skilled person will immediately appreciate).

It will be appreciated that the voltage swing (between "high" and "low" values) in the high voltage domain of the level shifter need not correspond to the voltage swing (between "high" and "low" values) in the low-voltage domain. In particular, the voltage swing in the high voltage domain may typically be set by the difference in voltage between $V_B$ and $V_C$, which is determined by the number of p-FETs in the series connected set, together with the number of N-FETs between the further p FET and the offset-bias outputs node $V_C$.

Figure 8:
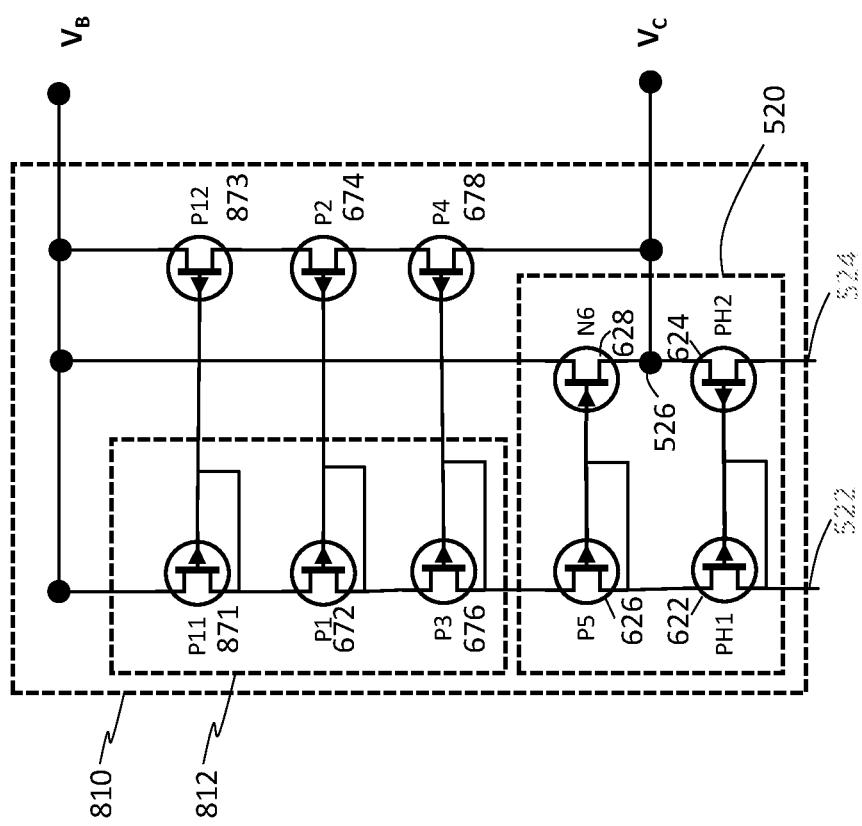
FIG. 8 shows a voltage-offset circuit 810, consistent with one or more embodiments.

Turning now to FIG. 8, this shows a voltage-offset circuit 810. The voltage-offset circuit 810 is similar to the voltage-offset circuit 510 shown in FIG. 6 with the exception that in this case M equals four. The push-pull circuit comprising pair of p-FETs pH1 622 and pH2 624 having commonly connected gates, and second pair of FETs, p-FET P5 626 and n-FET N6 628, is the same as that shown in FIG. 6.

P-FET P5 626 is further configured as the lowermost of a set of series-connected p-FETs P11 871, P1 672, P3 676, and P5 626, comprised in the voltage-offset circuit, and in this case P11 871 is connected to the high voltage rail $V_B$. Each of the p-FETs are "diode-connected", that is to say its gate is tied to its drain. Thus, this voltage-offset circuit includes a voltage-drop circuit 812 comprising the three p-FETs P11 871, P1 672 and P3 676. In operation, when there is current flowing, the voltage at the drain of the lowermost of the set of series-connected p-FETs (P11 871 P1 672, P3 676 and P5 626) is lower than the high-voltage rail voltage $V_B$, by the sum of the gate-source voltages (Vgs) of each of the transistors in the set. In this implementation there are four FETs so the voltage at the drain of P5 626 is 4×Vgs. Since the lowermost transistor P5 626 is diode connected, this is also the voltage at the common gates of P5 626 and N6 628. Furthermore, in operation—that is to say when there is current flowing through N6—the voltage between the gate and source of N6 is its threshold voltage, $V_T$. So the voltage at output node $V_C$ 526 differs from $V_B$ by 4·Vgs+$V_T$.

Furthermore, in the embodiment of FIG. 8, the additional set of series-connected p-type FETs, connected between the high-voltage-supply rail $V_B$ and the output node $V_C$ 526 comprises three p-FETs. P12 873, P2 674 and P4 678, having their gates connected to the gates of P11 871, P1 672 and P3 676 respectively.

Figure 9:
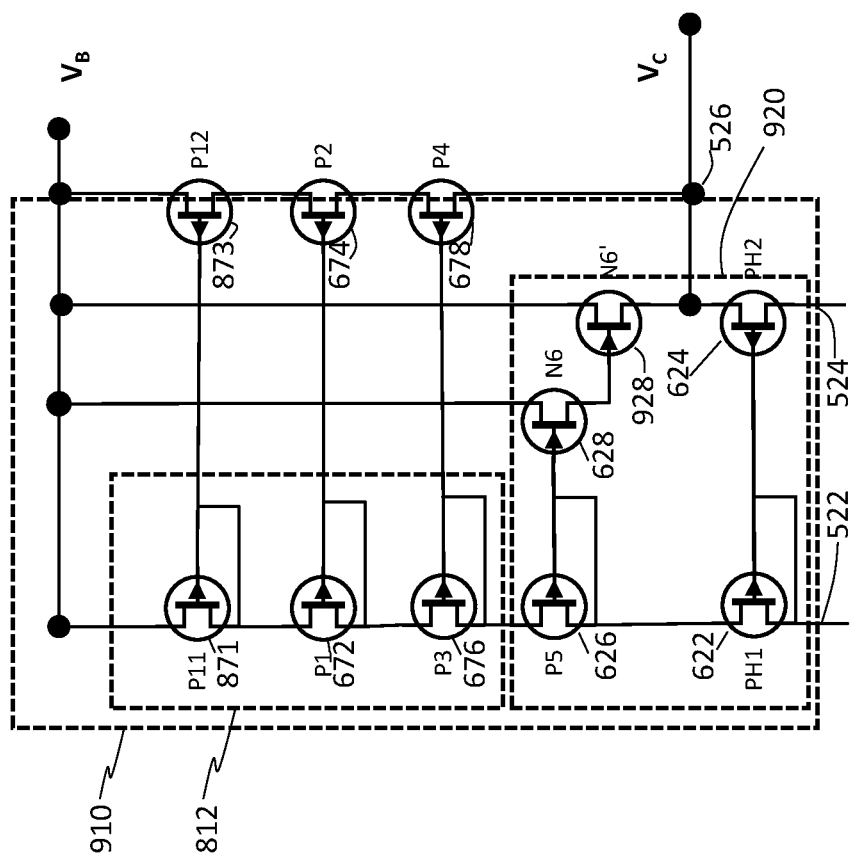
FIG. 9 shows another voltage offset circuit 910, consistent with one or more embodiments.

FIG. 9, shows a voltage-offset circuit 910. The voltage offset circuit 910 is similar to the voltage-offset circuit 810 shown in FIG. 8 with the exception that in this case the push-pull circuit, 920, includes a second n-FET N6' 928 between the, or first, n-FET P6 628 and offset bias node 526. A gate of the first n-FET is connected to the gate of the further p-FET, the drain of the first n-FET is connected to a gate of the second n-FET, the drain of the second n-FET is connected to the offset-bias output terminal, and the source of each of the first and second n-FET is connected to the high-voltage-supply terminal.

In embodiments including a voltage-offset circuit such as that shown in FIG. 9, the offset-voltage is then defined by:

$$V_C = V_B - (4 \cdot Vgs + 2 \cdot V_T).$$

It will be appreciated that in other embodiments, this can be generalised to:

$$V_C = V_B - (M \cdot Vgs + P \cdot V_T),$$

Where (M−1) is the number of series connected p-FETs in the voltage offset circuit 512, and P is the number of n-FETs in the path between the further p-FET P5 626 and the offset bias output terminal, that is to say, the output node $V_C$.

Experimentally it has been found that the high voltage circuit according to embodiments of the present disclosure can provide an output VC which is very stable with respect to, and follows variations in, PVT (process voltage and temperature. In particular, the design may enable the voltage offset to follow the sum of Vgs of the low voltage FETs, and in turn, Vgs is proportional to $V_T$+Vds, where Vds is the drain source voltage. Provided that it bias voltage Ib is kept constant, Vds is almost constant, and $V_T$ changes with PVT.

Furthermore, high voltage circuits according to some embodiments of the present disclosure may have relatively low power consumption (typically of the order of <100 nA) compared with conventional circuits and may be able to operate at relatively high frequencies (such as up to 10 Mhz) With respect to conventional circuits.

From reading the present disclosure, other variations and modifications will be apparent to the skilled person. Such variations and modifications may involve equivalent and other features which are already known in the art of level shifters and multi-voltage domain circuits and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

It is noted that one or more embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Features which are described in the context of separate embodiments may also be provided in combination in a single embodiment. Conversely, various features which are, for brevity, described in the context of a single embodiment, may also be provided separately or in any suitable sub-combination.

For the sake of completeness it is also stated that the term "comprising" does not exclude other elements or steps, the term "a" or "an" does not exclude a plurality, a single processor or other unit may fulfil the functions of several means recited in the claims [delete if not relevant] and reference signs in the claims shall not be construed as limiting the scope of the claims. Furthermore, the word "may" is used in a permissive sense (i.e., meaning having the potential to), rather than the mandatory sense (i.e., meaning must). Similarly, the words "include," "including," and "includes" mean including, but not limited to.

What is claimed is:

1. An electronic circuit, configured to switchably generate an offset-bias output at a offset-bias voltage ($V_C$) in response to at least an enable signal (EN) at a low voltage relative to the offset-bias voltage, and comprising:
   a reference input terminal, configured to be connected to a reference voltage (GND);
   a low-voltage-input terminal, configured to receive the enable signal at a first voltage;
   a high-voltage-supply terminal, configured to receive power at a second voltage ($V_B$);
   an offset-bias output terminal, configured to output the offset-bias output, wherein the offset-bias voltage is less than the second voltage;
   a voltage-offset circuit configured to generate the offset-bias voltage from the second voltage;
   a bias circuit configured to switchably provide a bias current (Ib1) to the voltage-offset circuit; and
   a high-voltage stand-off circuit, connected between the bias circuit and the voltage-offset circuit and configured to withstand a voltage difference between the second voltage ($V_B$) and the reference voltage (GND);
   wherein the voltage-offset circuit comprises:
   a push-pull circuit;
   a voltage-drop circuit comprising a series arrangement of a set of M−1 diode-connected p-FETs each having a gate-source voltage Vgs, connected between the high-voltage-supply terminal and a first node of the push-pull circuit to provide a voltage (M−1)·Vgs therebetween; and
   a variable current source, connected between the high-voltage-supply terminal and the offset-bias output terminal and configured to provide a variable current at the offset-bias output terminal to stabilise the offset-bias voltage;
   and wherein the push-pull circuit comprises a further p-FET having a gate-source voltage Vgs and at least one, N, n-FET connected between the high-voltage-supply terminal and the bias output terminal and having a threshold voltage Vt, and arranged to provide a voltage difference Vgs+N·(Vt) between the first node and the offset-bias output terminal;
   wherein M is a natural number greater than 1 and N is a natural number greater than 0.

2. The electronic circuit according to claim 1, further comprising a pull-up circuit (540) configured to tie the bias voltage to the second voltage in response to the enable signal not enabling the electronic circuit.

3. The electronic circuit according to claim 1, wherein each p-FET of the plurality of series-connected FETs is configured to be diode-connected by having a drain connected to its respective gate.

4. The electronic circuit according to claim 1, wherein M=3.

5. The electronic circuit according to claim 1, wherein N=1, and a source of the n-FET is connected to the high-voltage-supply terminal, and a drain of the n-FET is connected to the offset-bias output terminal.

6. The electronic circuit according to claim 1, wherein N=2, such that there is a first n-FET and a second n-FET, a gate of the first n-FET is connected to the gate of the further p-FET, a drain of the first n-FET is connected to a gate of a second n-FET, a drain of the second n-FET is connected to the offset-bias output terminal, and a source of each of the first and second n-FET is connected to the high-voltage-supply terminal.

7. The electronic circuit according to claim 1, wherein the bias circuit comprises a bias input configured to receive an input bias current, and a current mirror configured to provide the bias current (Ib1) as a copy of the input bias current (Ib).

8. The electronic circuit according to claim 7, further comprising a first switch configured to switchably disconnect the current mirror from the reference input terminal in response to the enable signal not enabling the electronic circuit.

9. The electronic circuit according to claim 7 further comprising a second switch configured to switchably disconnect the current mirror from the bias input in response to the enable signal not enabling the electronic circuit.

10. The electronic circuit according to claim 7, wherein the current mirror comprises a pair of n-FETs, any first switch comprises a p-FET, and any second switch comprises an n-FET.

11. The electronic circuit according to claim 1, wherein the push-pull circuit comprises at least one switch configured to switchably disconnect the push-pull circuit from at least one of the current mirror and the reference terminal, in response to the enable signal not enabling the electronic circuit.

12. The electronic circuit according to claim 1, wherein the set of series-connected FETs is a first set of series-connected FETs, and the voltage-offset circuit (510) further comprises an additional set of M−1 series-connected p-type FETs, connected between the high-voltage-supply rail ($V_B$) and the bias output terminal, each having a gate connected to a respective corresponding gate of the first set of series-connected FETs.

13. The electronic circuit according to claim 2, wherein the pull-up circuit comprises a resistor and a capacitor, each connected between the high-voltage-supply terminal and the bias output terminal.

14. The electronic circuit according to claim 1, further comprising an input terminal (IN), wherein the electronic circuit is configured to generate the bias output in response to both the enable signal and an input signal on the input terminal.

15. A level-shifting circuit arranged to shift a signal having a low and a high state from a low-voltage domain to a high-voltage domain, comprising:
a level shifter, wherein a offset-bias output is provided to the level shifter as a voltage for the low state of the high-voltage domain, and
an electronic circuit, configured to switchably generate an offset-bias output at a offset-bias voltage ($V_C$) in response to at least an enable signal (EN) at a low voltage relative to the offset-bias voltage, and comprising:
a reference input terminal, configured to be connected to a reference voltage (GND);
a low-voltage-input terminal, configured to receive the enable signal at a first voltage;
a high-voltage-supply terminal, configured to receive power at a second voltage ($V_B$);
an offset-bias output terminal, configured to output the offset-bias output, wherein the offset-bias voltage is less than the second voltage;
a voltage-offset circuit configured to generate the offset-bias voltage from the second voltage;
a bias circuit configured to switchably provide a bias current (Ib1) to the voltage-offset circuit; and
a high-voltage stand-off circuit, connected between the bias circuit and the voltage-offset circuit and configured to withstand a voltage difference between the second voltage ($V_B$) and the reference voltage (GND);
wherein the voltage-offset circuit comprises:
a push-pull circuit;
a voltage-drop circuit comprising a series arrangement of a set of M−1 diode-connected p-FETs each having a gate-source voltage Vgs, connected between the high-voltage-supply terminal and a first node of the push-pull circuit to provide a voltage (M−1)·Vgs therebetween; and
a variable current source, connected between the high-voltage-supply terminal and the offset-bias output terminal and configured to provide a variable current at the offset-bias output terminal to stabilise the offset-bias voltage;
and wherein the push-pull circuit comprises a further p-FET having a gate-source voltage Vgs and at least one, N, n-FET connected between the high-voltage-supply terminal and the bias output terminal and having a threshold voltage Vt, and arranged to provide a voltage difference Vgs+N·(Vt) between the first node and the offset-bias output terminal;
wherein M is a natural number greater than 1 and N is a natural number greater than 0.

16. The level-shifting circuit of claim 15, where in the reference voltage is 0 V, and the first voltage is a voltage between 1.0 and 5.5V.

17. The level-shifting circuit of claim 15, wherein a difference between the second voltage and the offset-by voltage is between 1.0 and 5.5V.

18. The level shifting circuit of claim 15, wherein the second voltage is between 24 and 48 V.

19. The level shifting circuit of claim 15, wherein the second voltage is between 100 and 200 V.

20. The level shifting circuit of claim 15, wherein the bias current is between 0.5 uA mA and 1 uA 10 mA.

* * * * *